US009391294B1

(12) United States Patent  
Xiao

(10) Patent No.: US 9,391,294 B1  
(45) Date of Patent: Jul. 12, 2016

(54) OLED DEVICE, PACKAGING METHOD THEREOF AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Ang Xiao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/818,577

(22) Filed: Aug. 5, 2015

(30) Foreign Application Priority Data

Dec. 8, 2014 (CN) .......................... 2014 1 0743734

(51) Int. Cl.
*H01L 21/447* (2006.01)
*H01L 51/52* (2006.01)
*H01L 51/56* (2006.01)

(52) U.S. Cl.
CPC ............ *H01L 51/5246* (2013.01); *H01L 51/56* (2013.01)

(58) Field of Classification Search
CPC .......................... H01L 51/5275; H01L 21/447
See application file for complete search history.

(56) References Cited

U.S. PATENT DOCUMENTS

2009/0140276 A1* 6/2009 Kuratate ................. H01J 61/35  
                                                                                          257/98

FOREIGN PATENT DOCUMENTS

| CN | 103022374 A | 4/2013 |
| CN | 103579294 A | 2/2014 |
| JP | 2012-074274 A | 4/2012 |

OTHER PUBLICATIONS

First Chinese Office Action Appln. No. 201410743734.9; Dated Apr. 26, 2016.

* cited by examiner

*Primary Examiner* — Mohammad Choudhry  
(74) *Attorney, Agent, or Firm* — Ladas & Parry LLP

(57) ABSTRACT

A packaging method for an OLED device, including: opening at least one through hole in a cover plate in a region between the region for forming glass cement and the region for applying UV glue; regulating the pressure in a cell-assembling chamber to a first pressure, and cell-assembling a back plate with the cover plate placed on a base board in the cell-assembling chamber with the first pressure lower than the atmospheric pressure; regulating the pressure in the cell-assembling chamber to the atmospheric pressure; curing the UV glue; regulating the pressure in the cell-assembling chamber to a second pressure that is lower than the atmospheric pressure and higher than the first pressure and detaching the cover plate from the base board; and sealing the through hole in the cover plate; and sintering the glass cement.

19 Claims, 4 Drawing Sheets

OLED DEVICE, PACKAGING METHOD THEREOF AND DISPLAY DEVICE

TECHNICAL FIELD

Embodiments of the present disclosure relate to an OLED device, a packaging method thereof and a display device.

BACKGROUND

Since organic light emitting diode (OLED) devices have many prominent performances such as ultra low weight and thickness, low cost, low power consumption, wide visual angle, full solidification, self-luminescence, low driving voltage, and easy realization of flexible display, and the like, OLED devices will become a new generation of flat panel display technology.

An OLED device is a display device that spontaneously illuminates when its luminescent materials are driven with current. Because organic luminescent materials are highly sensitive to temperature, air and moisture, correct packages are of great importance to keep favorable service life and picture quality of OLED devices.

Technologies for packaging small-sized OLED devices includes a technology that employs glass cement for packaging, and this process comprises the corresponding major packaging steps as follows: (1) screen printing glass cement onto a glass cover plate; (2) sintering the glass cement printed onto the glass cover plate; (3) applying UV glue onto the glass cover plate along the periphery of the glass cement; (4) in a cell-assembling chamber, cell-assembling the glass cover plate with a glass back plate formed with an OLED light-emitting element thereon; (5) curing the UV glue between the glass cover plate and the glass back plate using an ultraviolet lamp; and (6) laser-sintering the glass cement between the glass cover plate and the glass back plate after the curing with the ultraviolet lamp and cutting away the UV glue section to complete the packaging process.

During the process of the packaging process described above, the UV glue acts to encapsulate and thus protect the inside of the cell formed by cell-assembling the glass cover plate and the glass back plate that have not yet been laser-sintered, and therefore the UV glue must ensure to have no discontinuity and no poor adhesive bonding at the processing stage after the cell-assembling of the glass cover plate and the glass back plate while before the laser-sintering of the glass cement.

In order to ensure that the UV glue has no discontinuity and no poor adhesive bonding at the processing stage after the cell-assembling of the glass cover plate and the glass back plate while before the laser-sintering of the glass cement, a big difference (typically 95-100 KPa) between the air pressure inside the cell and the air pressure outside the cell is commonly used to ensure the UV glue to be pressed compact and the difference between pressures inside and outside the cell of the OLED device will be generally retained within the range of 95-100 KPa after the packaging of the OLED device is completed according to the above-mentioned packaging process. However, because the glass cement is fragile, the cell is prone to suffer from cracks and damages due to squeeze by the above-mentioned big difference between pressures inside and outside the cell.

SUMMARY

At least one embodiment of the present disclosure provides an OLED device, a packaging method thereof and a display device.

At least one embodiment of the present disclosure provides a packaging method for an OLED device, including: opening at least one through hole in a cover plate in a region between a region for forming glass cement and a region for applying UV glue, and forming the glass cement and applying the UV glue onto a same plate surface of the cover plate with the UV glue being applied along the periphery of the glass cement; regulating the pressure in a cell-assembling chamber to a first pressure, making a plate surface of a back plate formed with an OLED light emitting unit face the plate surface of the cover plate coated with the UV glue and formed with the glass cement, and cell-assembling the back plate with the cover plate placed on a base board in the cell-assembling chamber with the OLED light emitting unit being located correspondingly in the region surrounded by the glass cement and the first pressure being lower than the atmospheric pressure; regulating the pressure in the cell-assembling chamber to the atmospheric pressure; curing the UV glue; regulating the pressure in the cell-assembling chamber to a second pressure that is lower than the atmospheric pressure and higher than the first pressure and detaching the cover plate from the base board until the pressure in the cell formed by cell-assembling of the cover plate and the back plate reaches the second pressure; sealing the through hole in the cover plate; and sintering the glass cement.

The present disclosure further provides an OLED device, which uses the above-mentioned packaging method for an OLED device for its packaging.

At least one embodiment of the present disclosure further provides a display device that includes the above-mentioned OLED device.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

In order to clearly illustrate the technical solutions of embodiments of the disclosure, the drawings of the embodiments will be briefly described in the following; it is obvious that the described drawings are only related to some embodiments of the disclosure and thus are not limitative of the disclosure.

Figure 1A:
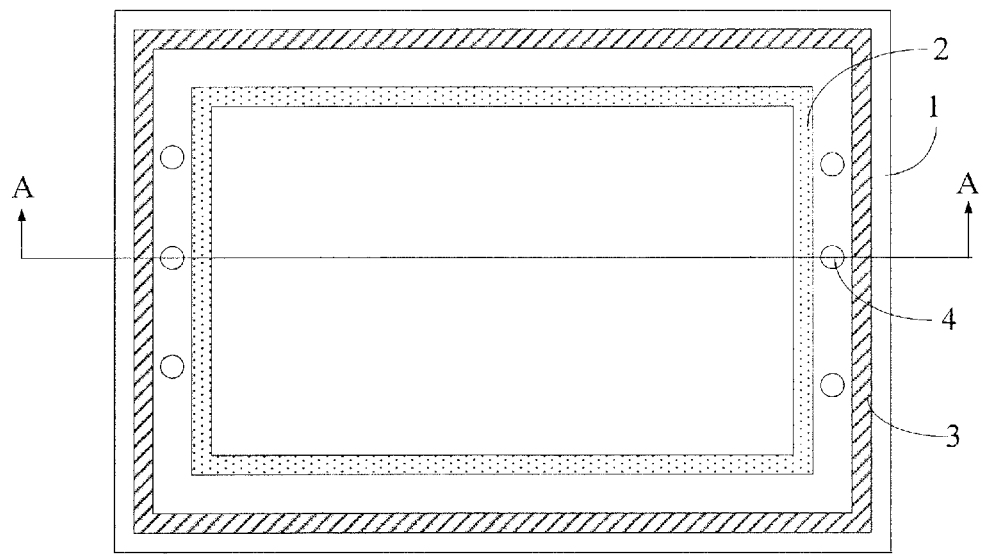
FIG. 1A and FIG. 1B are respectively a top view and a cross-sectional view of the package in step S1 of the packaging method for an OLED device in one embodiment of the present disclosure.

REFERENCE NUMERALS 1. cover plate; 2. glass cement; 3. UV glue; 4. through hole; 5. back plate; 6. OLED light emitting unit; 7. base board; 8. mask plate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the embodiments to be described are only some, not all, of the embodiments of the present disclosure. Based on the described embodiments herein, those skilled in the art can obtain other embodiment(s), without any inventive work, which should be within the scope of the disclosure.

At least one embodiment of the present disclosure provides a packaging method for an OLED device, which, as shown in FIGS. 1-8, includes the following steps.

Figure 1B:
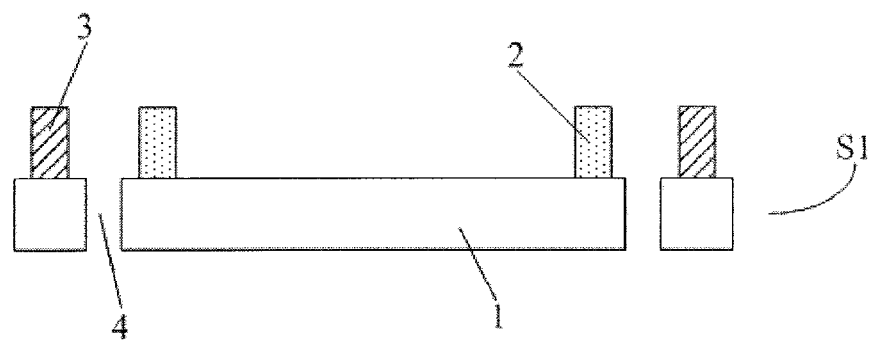

In step S1, via hole(s) 4 is (are) opened/formed in a cover plate 1 in a region between the region for forming glass cement 2 and the region for applying UV glue 3, and then glass cement 2 is formed on the cover plate 1 and UV glue 3 is applied onto the same surface of the cover plate 1 with the UV glue 3 being applied along the periphery of the glass cement 2, as shown in FIGS. 1A and 1B.

FIG. 1B corresponds to the cross-sectional view along line A-A of the structure shown in FIG. 1A. Likewise, the following FIGS. 2-8 are cross-sectional views taken along line A-A in respective steps.

This step may form a single through hole 4, or may form a plurality of through holes which for example may be uniformly distributed in the region between the UV glue 3 and the glass cement 2, but embodiments of the present disclosure are not limited to this. The plurality of through holes 4 are disposed to assist the pressure in the cell formed by cell-assembling of the cover plate 1 and a back plate 5 to reach a second pressure soon in a later step S5. The region for distribution of through holes 4 may have a width smaller than 1 mm. The diameters of the through holes 4 are within the range of 0.1-0.2 mm. Both the width of the distribution region for the through holes 4 and the diameters of the through holes 4 are small, which is favorable for the OLED device to achieve a narrow border (frame) display appearance and meanwhile can ensure the pressure in the cell formed by cell-assembling of the cover plate 1 and back plate 5 to reach the second pressure in the later step S5.

Additionally, in this step, with a screen printing method, glass cement 2 is formed onto the cover plate 1 and around the marginal region of the cover plate 1, and the UV glue 3 is applied along the periphery of the glass cement 2.

Figure 2:
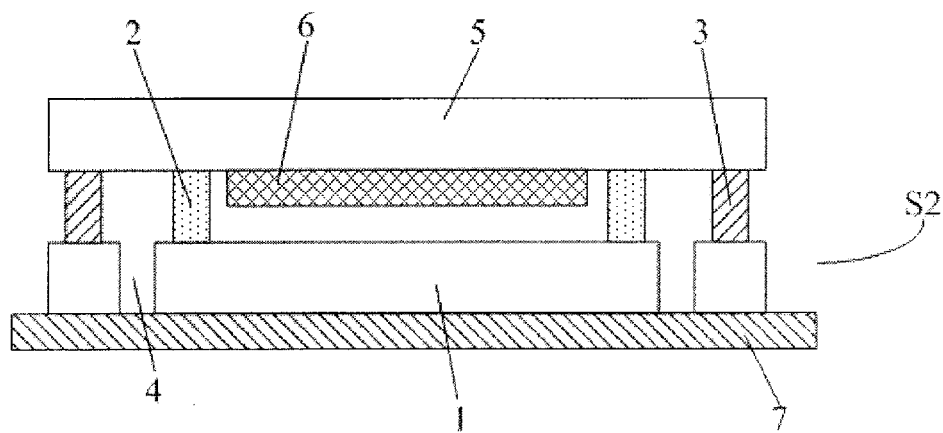
FIG. 2 is a cross-sectional view of the package when the pressure in the cell-assembling chamber is the first pressure in step S2 of the packaging method for an OLED device in one embodiment.

In step S2, the pressure in the cell-assembling chamber is regulated to a first pressure; the plate surface of the back plate 5 formed with an OLED light emitting unit 6 thereon is placed facing the plate surface of the cover plate 1 coated with UV glue 3 and formed with glass cement 2 thereon; the back plate 5 is cell-assembled with the cover plate 1 placed on a base board 7 in the cell-assembling chamber; and the OLED light emitting unit 6 is located correspondingly in the region surrounded by the glass cement 2. The first pressure is lower than the atmospheric pressure (or ambient pressure), as shown in FIG. 2.

For example, the first pressure is within the range of 2-5 kPa. In this step, the in-cell pressure (that is, the pressure inside the formed cell) between the cell-assembled cover plate 1 and back plate 5 is the same as that in the cell-assembling chamber, and both of them are 2-5 kPa.

For example, the OLED light emitting unit 6 includes a stack formed by a cathode, an organic light emitting layer and an anode, and may further include driving and switching circuit structures such as thin film transistors if required. The present disclosure is not limited to the specific structure and configuration of the OLED light emitting unit 6.

Figure 3:
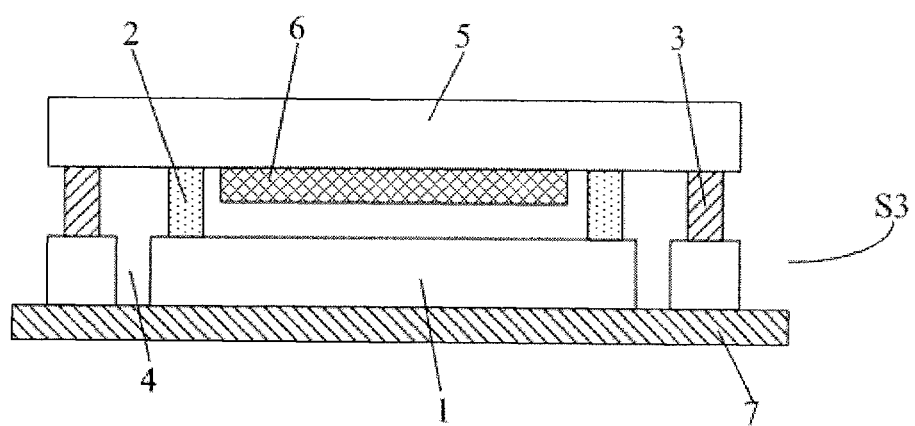
FIG. 3 is a cross-sectional view of the package when the pressure in the cell-assembling chamber is the atmospheric pressure in step S3 of the packaging method for an OLED device in one embodiment.

In step S3, the pressure in the cell-assembling chamber is regulated to the atmospheric pressure, as shown in FIG. 3.

In this step, after being regulated to the atmospheric pressure, the pressure in the cell-assembling chamber is higher than the in-cell pressure between the cover plate 1 and the back plate 5, because the through holes 4 in the cover plate 1 are blocked by the base board 7. Now, the UV glue 3 between the cover plate 1 and the back plate 5 that is still in an uncured state will be pressed compact by the atmospheric pressure. In this way, the UV glue 3 can ensure to have no discontinuity and no poor adhesive bonding if there are no air bubbles or discontinuity in the UV glue 3, so that before the glass cement between the cover plate 1 and the back plate 5 is sintered the UV glue 3 can provides good encapsulation and thus protection for the OLED light emitting unit 6 in the cell formed by cell-assembling of the cover plate 1 and the back plate 5.

Figure 4:
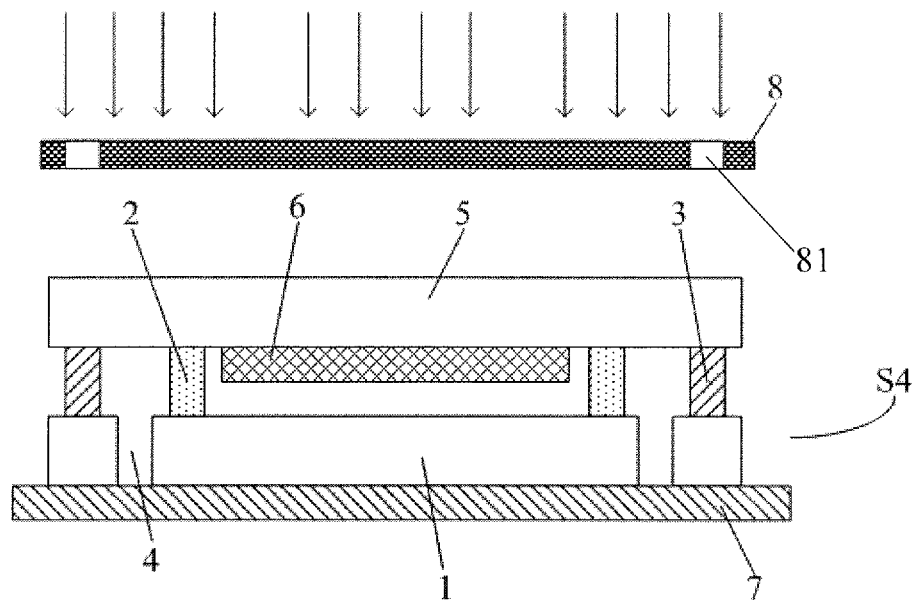
FIG. 4 is a cross-sectional view of the package in step S4 of the packaging method for an OLED device in one embodiment.

In step S4, the UV glue 3 is cured, as shown in FIG. 4.

A specific example of this step can be carried out as follows. In this specific example, a mask plate 8 is used in the exposure of the UV glue 3. The UV glue 3 is cured by ultraviolet rays (the downward arrows in the figure) emitted by an ultraviolet radiation assembly (not shown) and passing through a light transmitting pattern 81 in the mask plate 8 with the pattern 81 being the same as or corresponding to that of the region with the UV glue 3 located therein. Since UV glue 3 is sandwiched between the cover plate 1 and the back plate 5 after the cell-assembling thereof, the highly temperature-sensitive OLED light emitting unit 6 located between the cover plate 1 and the back plate 5 as well may be affected or damaged when the UV glue 3 is being cured with ultraviolet rays. As a result, the UV glue 3 can be cured by the ultraviolet rays having passed through the mask plate 8 having the light transmitting pattern 81 corresponding to the UV glue 3 only, and this process at the same time protects the OLED light emitting unit 6 from being radiated by the ultraviolet rays very well so as to prevent it from being damaged during the encapsulating for itself.

Figure 5:
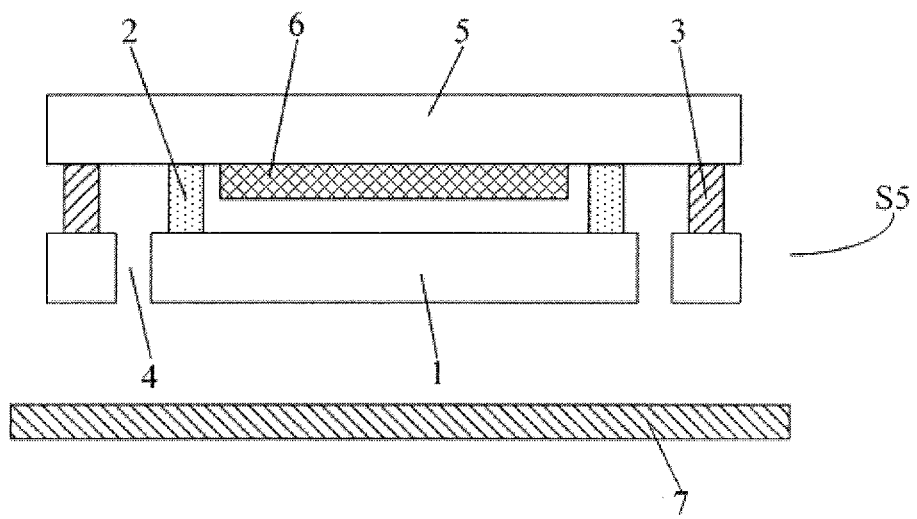
FIG. 5 is a cross-sectional view of the package when the pressure in the cell-assembling chamber is the second pressure in step S5 of the packaging method for an OLED device in one embodiment.

In step S5, the pressure in the cell-assembling chamber is regulated to a second pressure lower than the atmospheric pressure and higher than the first pressure until the pressure in the cell formed by cell-assembling of the cover plate 1 and the back plate 5 reaches the second pressure, and therefore the cover plate 1 is detached from the base board 7, as shown in FIG. 5.

For example, the second pressure is within the range of 15-30 kPa.

In this step, the cell-assembling chamber communicates with the inside of the cell between the cover plate 1 and the back plate 5 via through holes 4 after the cover plate 1 is detached from the base board 7, so that the air in the cell-assembling chamber can enter the cell between the cover plate 1 and the back plate 5 via the through holes 4 and gaps between the unsintered glass cement 2 and the back plate 5, which ultimately makes the in-cell pressure between the cover plate 1 and the back plate 5 reach the second pressure.

Figure 6:
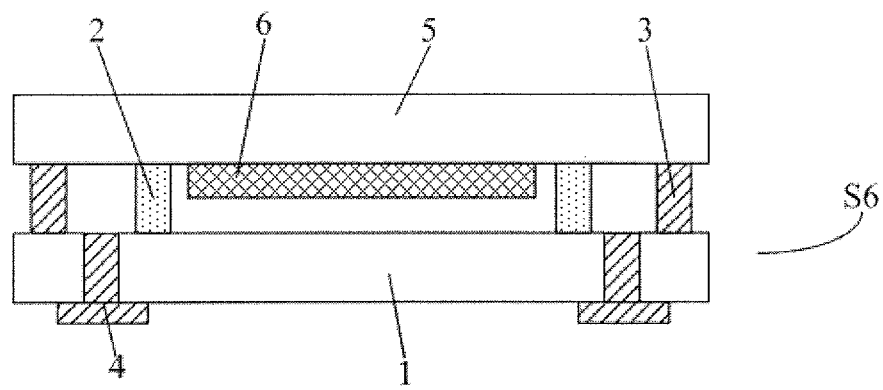
FIG. 6 is a cross-sectional view of the package in step S6 of the packaging method for an OLED device in one embodiment.

In step S6, the through holes 4 in the cover plate 1 are sealed (or blocked), as shown in FIG. 6.

A specific example of this step includes: sealing the through holes 4 in the cover plate 1 using UV glue and curing the UV glue after the sealing. The through holes 4 may be sealed in other ways, and the present disclosure is not limited thereto.

Figure 7:
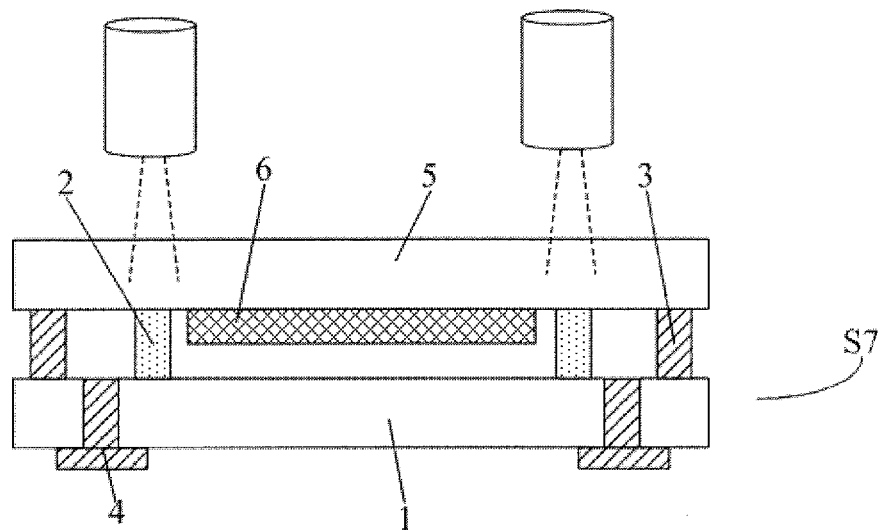
FIG. 7 is a cross-sectional view of the package in step S6 of the packaging method for an OLED device in one embodiment.

In step S7, the glass cement 2 is sintered, as shown in FIG. 7.

In this step, the glass cement 2 is sintered by laser radiation, for example. After the glass cement 2 is sintered, the cover plate 1 and the back plate 5 can be adhesively bonded together so as to encapsulate the OLED light emitting unit 6.

In this step, after the glass cement 2 is sintered, the in-cell pressure between the cover plate 1 and the back plate 5 is the second pressure, i.e., 15-30 kPa.

In step S8, the section of the OLED cell formed by cell-assembling of the back plate 1 and the back plate 5 corresponding to the through holes 4 and the section from the through holes 4 to the edge of the OLED cell are cut off.

Figure 8:
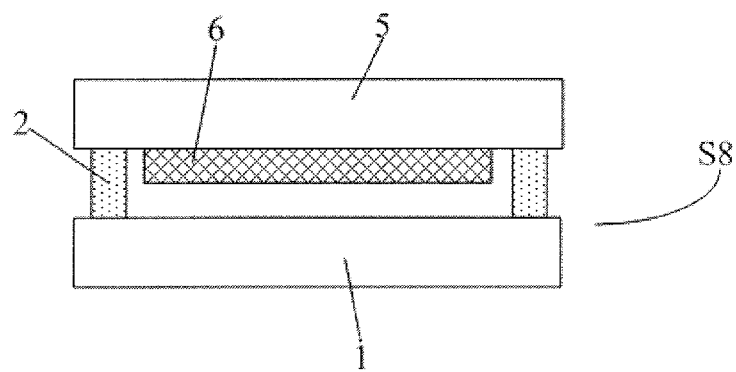
FIG. 8 is a cross-sectional view of the package in step S8 of the packaging method for an OLED device in one embodiment.

In the ultimately formed OLED device after being packaged, the OLED light emitting unit 6 is only encapsulated by the glass cement 2 between the cover plate 1 and the back plate 5, as shown in FIG. 8.

So far, the packaging of the OLED device has been completed. The packaged OLED device will finally be used at the atmospheric pressure because the pressure of our environment is the atmospheric pressure. Therefore, the pressure acting on the glass cement 2 between the cover plate 1 and the back plate 5 is the difference between the atmospheric pressure and the second pressure. In the present embodiment, for example, the difference between the pressures inside and outside the OLED cell is within the range of 70-85 kPa, which is lower than that of a common OLED device and substantially causes no cracks and damages to the glass cement 2 under squeeze, thereby effectively alleviating the disadvantage that the glass cement 2 is prone to suffer from cracks and damages due to squeeze by the difference between pressures inside and outside the cell.

In the packaging method for an OLED device provided in at least one embodiment of the present disclosure, through holes are opened in the cover plate and the pressure in the cell-assembling chamber is regulated three times during the packaging process, so that not only the UV glue can be pressed compact at the processing stage after the cell-assembling of the cover plate and the back plate while before the sintering of the glass cement to prevent discontinuity and poor adhesive bonding from occurring to the UV glue and thus ensure good encapsulation for the OLED light emitting unit with the UV glue, but also the packaged OLED device can have a moderate difference between pressures inside and outside the cell to effectively alleviate the disadvantage that the glass cement is prone to suffer from cracks and damages under the squeeze by the pressure difference between inside and outside the cell.

At least one embodiment of the present disclosure provides an OLED device, which uses the packaging method in the above-mentioned embodiment for its packaging.

The OLED device uses the packaging method in the above-mentioned embodiment for its packaging, so that the disadvantage that the glass cement is prone to suffer from cracks and damages under the squeeze by the pressure difference between inside and outside the cell and in turn the packaging effects of the OLED device are alleviated.

At least one embodiment of the present disclosure provides a display device that includes the above-mentioned OLED device.

Using the OLED device provided in at least one embodiment of the present disclosure, not only the packaging effects but also the packaging quality of the display device can be improved.

The display device provided in the embodiment of the present disclosure may be any product or component with OLED display functionality, such as an OLED panel, an OLED TV, an OLED display, an OLED cellphone, an OLED navigator, and the like.

The embodiment of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

The present application claims priority of China patent application No. 201410743734.9 filed on Dec. 8, 2014, disclosure of which is incorporated herein in its entirety by reference as a part of the present application.

What is claimed is:

1. A packaging method for an OLED device, comprising:
opening at least one through hole in a cover plate in a region between a region for forming glass cement and a region for applying UV glue, and forming the glass cement and applying the UV glue onto a same plate surface of the cover plate with the UV glue being applied along the periphery of the glass cement;
regulating a pressure in a cell-assembling chamber to a first pressure, making a plate surface of a back plate formed with an OLED light emitting unit face the plate surface of the cover plate coated with the UV glue and formed with the glass cement, and cell-assembling the back plate with the cover plate placed on a base board in the cell-assembling chamber with the OLED light emitting unit being located correspondingly in the region surrounded by the glass cement, and the first pressure being lower than the atmospheric pressure;
regulating the pressure in the cell-assembling chamber to the atmospheric pressure;
curing the UV glue;
regulating the pressure in the cell-assembling chamber to a second pressure that is lower than the atmospheric pressure and higher than the first pressure and detaching the cover plate from the base board until the pressure in the cell formed by cell-assembling of the cover plate and the back plate reaches the second pressure;
sealing the through hole in the cover plate; and
sintering the glass cement.

2. The packaging method of claim 1, wherein the first pressure is within the range of 2-5 kPa, and the second pressure is within the range of 15-30 kPa.

3. The packaging method of claim 1, comprising a plurality of through holes, which are uniformly distributed in the region between the UV glue and the glass cement.

4. The packaging method of claim 3, wherein a width of the region for the distribution of the through holes is smaller than 1 mm.

5. The packaging method of claim 1, wherein a diameter of the through hole is within the range of 0.1-0.2 mm.

6. The packaging method of claim 1, wherein the UV glue is cured by ultraviolet rays passing through a light transmitting pattern in a mask plate with the pattern being corresponding to that of the region with the UV glue located therein.

7. The packaging method of claim 6, wherein the through hole in the cover plate is sealed by UV glue, which will be cured after sealing.

8. The packaging method of claim 1, wherein the glass cement is sintered by laser radiation.

9. The packaging method of claim 1, further comprising, after the glass cement having been sintered,
   cutting off a section of the OLED cell formed by cell-assembling of the back plate and the back plate corresponding to the through hole and a section from the through hole to the edge of the OLED cell.

10. The packaging method of claim 1, wherein the glass cement is formed onto the cover plate around a marginal region of the cover plate by screen printing; and the UV glue is applied along the periphery of the glass cement.

11. The packaging method of claim 2, comprising a plurality of through holes, which are uniformly distributed in the region between the UV glue and the glass cement.

12. The packaging method of claim 2, wherein the UV glue is cured by ultraviolet rays passing through a light transmitting pattern in a mask plate with the pattern being corresponding to that of the region with the UV glue located therein.

13. The packaging method of claim 12, wherein the through hole in the cover plate is sealed by UV glue, which will be cured after sealing.

14. The packaging method of claim 2, wherein the glass cement is sintered by laser radiation.

15. The packaging method of claim 1, further comprising, after the glass cement having been sintered,
   cutting off a section of the OLED cell formed by cell-assembling of the back plate and the back plate corresponding to the through hole and a section from the through hole to the edge of the OLED cell.

16. The packaging method of claim 2, wherein the glass cement is formed onto the cover plate around a marginal region of the cover plate by screen printing; and the UV glue is applied along the periphery of the glass cement.

17. The packaging method of claim 6, wherein the glass cement is sintered by laser radiation.

18. The packaging method of claim 6, further comprising, after the glass cement having been sintered,
   cutting off a section of the OLED cell formed by cell-assembling of the back plate and the back plate corresponding to the through hole and a section from the through hole to the edge of the OLED cell.

19. The packaging method of claim 6, wherein the glass cement is formed onto the cover plate around a marginal region of the cover plate by screen printing; and the UV glue is applied along the periphery of the glass cement.

* * * * *